Feb. 26, 1963 B. RABINOVICI 3,079,508

READOUT DEVICE

Filed Jan. 19, 1960

INVENTOR
BENJAMIN RABINOVICI

Thomas & Crickenberger

ATTORNEYS

United States Patent Office 3,079,508
Patented Feb. 26, 1963

3,079,508
READOUT DEVICE
Benjamin Rabinovici, New York, N.Y., assignor to International Business Machines Corporation, New York, N.Y., a corporation of New York
Filed Jan. 19, 1960, Ser. No. 3,348
2 Claims. (Cl. 250—225)

This invention relates to devices for reading information from data processing equipment and more particularly to such devices for transferring information from such equipment to output equipment without the use of electrical wires or leads therebetween.

This invention is applicable to data processing equipment in general, and it is especially useful with data processing equipment constructed from superconductive components. Cryogneic data processing equipment usually includes among other things a number of superconductive devices situated in a suitable cooling bath such as liquid helium. It is customary to transfer information from such superconductive devices along electrically conductive wires or leads to output equipment operating at room temperature. These electrically conductive wires or leads extend from the cooling bath which is at a temperature in the neighborhood of 1° to 5° Kelvin into a medium of much higher temperature, and because of the large difference in temperature, a relatively large amount of heat is conducted into the cooling bath along the wires or leads.

In operating the superconductive devices, magnetic fields are employed to cause the superconductors to change from their superconducting to their normal or resistive state. Heat is generated as the result of the build up and collapse of the magnetic fields during operation, and this heat is transferred to the cooling bath thereby raising its temperature. Since the magnetic field required to make a superconductor go normal decreases as the temperature increases, the combined effect of the heat produced in the bath by the magnetic fields during operation and the heat conducted into the cooling bath along the wires or leads may cause a considerable variation in the temperature of the cooling bath. The magnitudes of the currents and the consequent magnetic fields may be too large or too small for reliable operation, depending on the type of logic employed. As a result, erratic operation of the superconductive devices may occur. Further, increases in the temperature of the cooling bath increase the load of the cooling equipment for the superconductive devices, and this may tend to reduce the efficiency of the cooling equipment. Moreover, since the output signal from the superconductive devices is generally a low level signal derived by measuring the small voltage drop across a resistive superconductor, this signal, which includes a noise component, must be amplified. When this signal is amplified, the noise is also amplified thereby producing the undesired effect of an output signal having a low signal-to-noise ratio.

The present invention minimizes the foregoing difficulties by the provision of a device for reading information from data processing equipment that utilizes no physical connections to the equipment. Such a device employed with superconductive data processing equipment eliminates the heat leaks occasioned by extending conducting output wires or leads from the equipment. Radiant energy serves as the link between the final stages of data processing equipment and the output equipment. The plane of polarization of radiant energy changes from a reference plane or remains at the reference plane depending upon the information signals present in the final stages of the data processing equipment.

According to this invention there is provided in the output stage of data processing equipment a material which responds to a magnetic field to rotate the plane of polarization of radiant energy directed through this material. The output signals of the data processing equipment may be employed to provide a magnetic field which rotates the plane of polarization of the radiant energy. When the plane of polarization of the radiant energy is rotated from a reference position, a detector device responds to this energy and provides an output signal. When the plane or polarization of the radiant energy is not rotated, the detector device receives no radiant energy and provides no output signal.

In an illustrative arrangement of this invention a device is provided for reading information from a superconductive circuit where no physical connections are made between the device and the superconductive circuit. In the output stage of the superconductive circuit a material which responds to a magnetic field to rotate the plane of polarization of radiant energy such as light is utilized. When an output signal is present in an output stage of the superconductive circuit, the plane of polarization of a beam of light is rotated from a reference position by this material so that the beam passes through an analyzer and impinges upon a light sensitive device which produces an output signal. When no output signal is present in the output stage of the superconductive circuit, the plane of polarization of the light beam is not rotated by this material; hence, the beam is not passed by the analyzer and no output signal is produced by the light senstive device. The light sensitive device is coupled to output equipment operating at room temperature. Therefore, no wires or leads are necessary between the superconductive circuit and the output equipment thereby eliminating the heat leaks caused by the use of output wires or leads extending from the superconductive circuit.

According to another aspect of the present invention, a readout device for a superconductive circuit is provided which may produce high gain output signals having a high signal-to-noise ratio. The relatively low level information signals of the superconductive circuit which are usually detected by measuring the small voltage drop across a resistive superconductor are employed to create a magnetic field which causes a material, disposed within the influence of the magnetic field, to rotate the plane of polarization of radiant energy passing through the material. When the plane of polarization of the radiant energy is rotated from this reference position, a detector responds to this radiant energy and produces an output signal. The magnitude of the information signals from the superconductive circuit is quite low, but the strength of the magnetic field may be increased without increasing the noise level thereby causing relatively greater output signals from the detector. From this standpoint there is high gain and a high signal-to-noise ratio. The gain and the signal-to-noise ratio of the readout device depends among other things upon the strength of the magnetic field, the type and absorption characteristics of the material, the intensity and the wavelength of the radiant energy and the sensitivity of the detector. In each case, however, the detector produces an output signal having a magnitude which is much greater and which has a noise component that is much smaller than that of the signals employed in the final or output stages of the cryogenic devices.

According to another feature of the present invention a flashing light is used for reading information from a superconductive circuit. The light is off except when reading is taking place. Thus, the light is off more than it is on. During the period the light source is on a beam of polarized light is directed onto or through a material associated with the superconductive circuit in each output stage. Information signals in the superconductive circuit of each output stage cause this material to rotate the plane of polarization of the light beam from a reference position or not so that the light beam is received or not by a light sensitive device which in turn provides a readout signal or no readout signal. By using a flashing light instead of a continuous light, the background light is reduced and this causes the output signal of the readout device to have an increased signal-to-noise ratio.

These and other features of this invention may be more fully appreciated when considered in light of the following specification and drawing in which.

Figures 1, 2, 3:
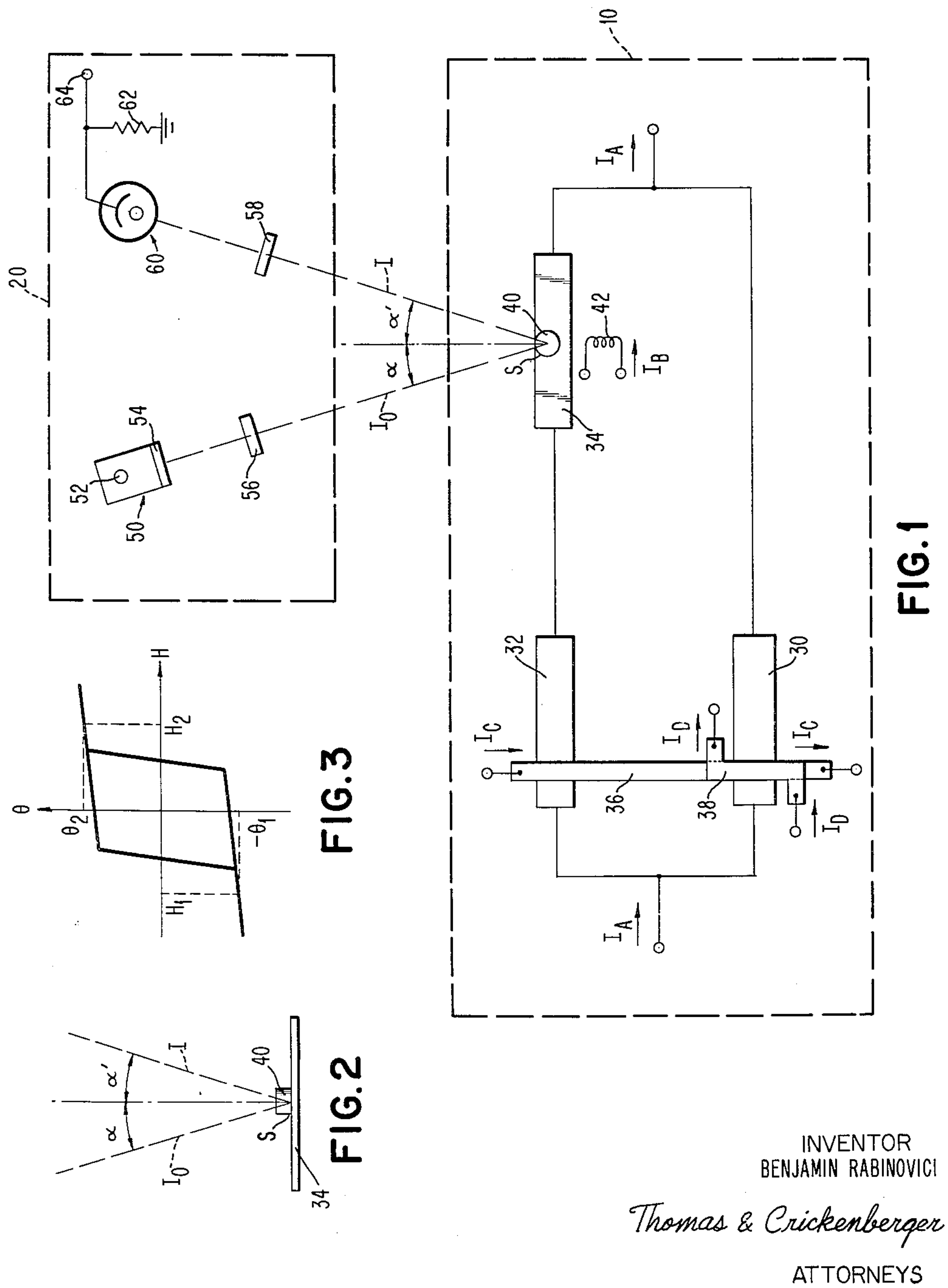
FIG. 1 illustrates a readout device employing the principles of the present invention.
FIG. 2 is a side view of a portion of the structure shown in FIG. 1.
FIG. 3 illustrates a hysteresis loop of a material employed in the device of FIG. 1.

Each of the gates of the cryotrons in the cryogenic circuit disclosed herein is constructed of a material which is in a superconductive state at the operating temperature of the circuit in the absence of a magnetic field, but each gate is driven resistive or normal by a magnetic field produced when a current greater than a predetermined minimum or threshold current flows in its control winding. The remaining portions of the circuit, that is, the cryotron control windings and the connections between the various components are fabricated of a superconductor material which remains in a superconductive state under all conditions of the circuit operation. For example, the gates may be constructed of tantalum, and the remaining portions of the circuit may be constructed of niobium, or other suitable materials may be employed, such as those discussed in the article by D. A. Buck, "The Cryotron—A Superconductive Computer Component," Proceedings of the IRE, pp. 482–493; April, 1956. Each of the components in the cryogenic circuit illustrated may be a film-type component. These components essentially are strips or coatings of the superconductor materials mentioned above. For a detailed discussion of film-type superconductive devices and the manner in which they may be constructed, reference may be made to copending applications Serial No. 625,512 and Serial No. 765,760, now Patent No. 3,047,230, filed on November 30, 1956 and October 7, 1958, respectively, both of which have been assigned to the assignee of the present invention.

The present invention is illustrated and described as it may be used with cryogenic circuits and radiant energy in the light spectrum, although the principles of the present invention are not limited to superconductive circuits or radiant energy in any particular frequency spectrum. Referring to FIGS. 1 and 2, the numeral 10 denotes an output stage of a cryogenic circuit which is situated in a cooling bath (not shown) such as liquid helium. The numeral 20 denotes a readout device which is operating at room temperature. The output of the readout device 20 may be connected to control output equipment, not shown. The output stage 10 of the cryogenic circuit includes a cryotron gate 30 connected in parallel with a series circuit including a cryotron gate 32 and an element 34. The element 34 may be a superconductor element in which case it remains superconductive under all conditions of circuit operation. A control winding 36 is disposed on both of the gates 30 and 32 and a control winding 38 is disposed on the gate 30. The control winding 38 and the control winding 36 are registered, i.e., one control winding is on top of the other so that the magnetic field produced by current flowing in each of these windings affects the same area of the gate 30.

According to a feature of this invention a material 40, which rotates the plane of polarization of radiant energy upon the application of a magnetic field, is positioned adjacent to the edge of the element 34 as shown in a top view in FIG. 1 and in a side view in FIG. 2. This phenomenon is termed the Faraday Effect. Numerous substances that exhibit this effect may be used as the material 40. Examples of such substances that are useful with radiant energy in the light spectrum are: cerous oxide highly doped glasses, ferrimagnetic garnets (such as yttrium, erbium, samarium and gadolinium iron garnets), cerous nitrite, and paramagnetic salts. Certain substances exhibit a greater rotation than others for given magnetic field and temperature conditions, and therefore, the choice of a particular substance depends upon the specific circuit application. The material 40 may be any convenient shape such as circular (illustrated), rectangular, etc.

The material 40 is preferably positioned near the edge of the element 34 where the largest field is produced by current flow through this element. The element 34 is employed as the support for the material 40 and this material may be affixed to the element 34. The surface of the element 34 is preferably shiny in order to act as a good reflector of the incident beam of radiant energy passing through the material 40.

The angle of rotation of the transmitted beam of polarized light I caused by the material 40 is linearly proportional to the thickness of the material 40, but this rotation has a non-linear dependence on light wavelength. The light transmission of the material 40 follows the exponential relation $$I=I_0e^{-\alpha x}$$

where $I$=intensity of the transmitted beam,
$I_0$=intensity of the incident beam,
$\alpha$=coefficient of absorption (depends on light wavelength), and
$x$=thickness of the material 40.

In addition to acting as a support for the material 40 the element 34 serves to apply a magnetic field to the material 40. The field produced by a current flowing through the element 34 is applied to control the material 40 and thereby control the rotation of the plane of polarization of the transmitted light beam I. Whenever a ferrimagnetic substance (such as one of those noted above) is employed as the material 40, a bias winding 42 is used to apply a bias field to this material 40. Ferrimagnetic substances exhibit a hysteresis loop of angle of rotation versus applied magnetic field, as illustrated in FIG. 3, and a magnetic field produced by current flow in the bias winding 42 serves to reset the ferrimagnetic substance. When other materials such as cerous oxide glass or paramagnetic salts are employed for the material 40, the bias winding 42 is not needed. Although the bias winding 42 is illustrated as a coil for purposes of clarity, it is preferably a film-type component. If desired, the element 34 may be a superconductor element but this is not necessary. If a superconductor element is employed for the element 34, the fields produced by current flowing through this element and current flowing through the bias winding 42 do not make the element 34 go normal.

The readout device 20 of FIG. 1 includes as a source of radiant energy a light source 50 which is preferably monocromatic and may include a lamp 52 and a filter 54. The light beam from the source 50 is polarized by a polarizer 56. The resulting polarized beam of light $I_0$, illustrated in FIGS. 1 and 2, passes down through the material 40 and is reflected by the shiny surface of the element 34 up through the material 40. By reflecting the polarized beam of light in this manner the beam of light passes through the material 40 twice. Hence, the angle of rotation of the polarized beam of light is at least twice the rotation achieved by only transmitting the beam of light directly through the material 40 once.

The container (not shown) housing the cryogenic circuit and the cooling bath includes a window which may act as the filter and through which the light beams $I_0$ and I may pass. As shown in FIG. 1 an analyzer which is also a polarizer is employed between the material 40 and the light sensitive detector 60 to pass or block the transmitted beam I as will be explained in greater detail hereinafter. A beam of light may be resolved into two components $x$ and $y$. One of the polarizers 56 and 58 eliminates the $x$ component of a light beam while the other serves to eliminate the $y$ component. For purposes of illustration it is assumed that polarizers 56 and 58 serve to eliminate the respective $x$ and $y$ components of light. The light sensitive device 60 may be any one of the many well known light sensitive devices such as a phototransistor or a photomultiplier. The choice of a particular light sensitive device depends upon the degree of sensitivity required in a particular system. A load resistor 62 is connected between the light sensitive device 60 and ground, and an output voltage is developed between a terminal 64 and ground whenever the transmitted beam of light I strikes the light sensitive device 60. Although a certain amount of light energy is absorbed by the material 40 and this energy may be conveyed to the cooling bath in which the output stage 10 is situated, the loss occasioned by this absorption is negligible compared to the heat losses occasioned by physically extending output leads from the output stage 10 to output equipment operating at room temperature.

The operation of the device of FIG. 1 is now described with reference to FIG. 3. When a current $I_D$ flows through the winding 38, the gate 30 goes normal or resistive. A current $I_A$ is caused to flow through the gate 32 and the element 34 since the gate 30 is resistive. Assuming for example that a ferrimagnetic substance is used for the material 40 the bias winding 42 is utilized and a current $I_B$ flows in this winding at all times. The axis of the bias winding 42 is perpendicular to the reflecting surface of the element 34 so that the magnetic field produced by the current $I_B$ has the same direction as the magnetic field produced by the current $I_A$. The fields produced by these currents $I_A$ and $I_B$ are substantially parallel to the direction of the light beam. Only the component of the applied magnetic field parallel to the direction of the light beam is effective to cause the material 40 to rotate the plane of polarization of the light beam. The angles $\alpha$ and $\alpha'$ of the incident beam $I_o$ and the transmitted beam I, respectively, illustrated in FIGS. 1 and 2 are preferably small. When these angles are small, the applied magnetic field has the greatest effect on the material 40 to cause this material to rotate the plane of polarization of the light beam. The net magnetic field which is caused by the currents $I_A$ and $I_B$ is applied to the material 40 and this net magnetic field has a value of $H_1$. The angle of rotation $-\theta_1$ of the plane of polarization of the transmitted light beam I produced by the field $H_1$ is illustrated in FIG. 3 and represents the steady state condition. When the transmitted beam of light I is rotated through an angle $-\theta_1$ the beam does not pass through the analyzer 58. In other words, when a field $H_1$ is applied to the material 40 the polarized incident beam of light $I_o$ is rotated through such an angle that it does not pass through the analyzer 58. An output signal in the cryogenic circuit is a current pulse $I_C$ which flows through the winding 36. This current $I_C$ makes the gate 32 go normal. The field produced by the current pulse $I_C$ opposes the field produced by the current $I_D$ thereby allowing the gate 30 to go superconductive. This action diverts the current $I_A$ from the gate 32 and the element 34 through the gate 30. When the current $I_A$ is no longer flowing through element 34, the magnetic field in the region of the material 40 is produced only by the current $I_B$ flowing through the bias winding 42 and this field is a value of $H_2$. As shown in FIG. 3 an angle of rotation $+\theta_2$ of the plane of polarization of the transmitted beam of light I is produced by the field $H_2$. Thus, the angle of the plane of light polarization is changed by $\theta_1+\theta_2$ and the transmitted beam of light I passes through the analyzer 58 according to the relation:

$$I=I_o \sin^2 (\theta_1+\theta_2)$$

or, for small angles $$I=I_o (\theta_1+\theta_2)^2$$

During the period of time that the winding 36 is energized by the current pulse $I_C$ the transmitted beam of light I passes through the analyzer 58 and strikes the light sensitive 60 which converts this light beam into an output voltage.

Although numerous substances may be employed as the material 40, the following is set forth as an illustration of the operation of the system employing a particular material and radiant energy in the light spectrum. A piece of cerous oxide highly doped glass one millimeter thick used as the material 40 produces a 12 degree rotation in the presence of a field of 100 gauss when using a light beam having a wavelength in the vicinity of 4,000 angstroms and a helium bath temperature of 2.5 degrees Kelvin. This is given as an example only and a wide range of operation may be obtained by the choice of the material 40, its thickness, the applied field and the wavelength and intensity of the radiant energy. The angular rotation of 12 degrees may be more than necessary in certain applications and one degree may be sufficient in some systems. The readout switching frequency of the readout device depends upon the choice of the above variables and this frequency may extend into the megacycle range.

As noted before, a bias field from the bias winding 42 is not required when materials other than ferrimagnetic substances are used for the material 40. The rotation of the plane of polarization of the light beam when employing materials other than ferrimagnetic substances is caused solely by the change in the magnetic field produced by a change in the current flowing through the element 34. As in the above illustration the current flowing through the element 34 is changed by the application of an information current pulse $I_C$ to the control winding 36. When the current $I_A$ flows through the element 34, the resulting magnetic field causes the material 40 to rotate the plane or polarization of the light beam so that it does not strike the detector 60. This is the steady state condition. When a current pulse $I_C$ is applied to the winding 36, the current $I_A$ is diverted from the gate 32 and the element 34. No magnetic field is produced and the light beam is allowed to strike the detector 60 which produces an output signal. Although in the foregoing illustrations of operation of the device of the present invention a current pulse $I_C$ applied to the winding 36 causes the detector 60 to produce an output signal, it is to be understood that the reverse operation may be utilized. In such a case the polarizer 56 and the analyzer 58 are arranged so that the absence of current in the winding 36 and consequently the presence of current in the element 34 causes the light beam to strike the detector 60 which produces an output signal.

Although the material 40 is illustrated as positioned on top of the element 34, it may be positioned so that the light beam is transmitted directly through the material 40 to the analyzer 58 if desired. The only requirement pertaining to the positioning of the material 40 is that it be positioned in the field produced by the current $I_A$ flowing through the element 34 and the current $I_B$ flowing through the bias winding 42 and that the magnetic field be in the same direction as the light beam.

According to a further feature of the present invention an output signal having a high signal-to-noise ratio and a high gain is produced by the readout device 20. Usually when reading information from a cryogenic circuit a superconductor element is caused to change state and this change of state is detected by measuring the voltage drop across the superconductor element. This voltage drop is caused by current flowing through the resistance introduced into the superconductor element when the superconductor element is made normal. The voltage signal developed is small, usually less than a millivolt for high speed operation, and the noise component in this signal is relatively high. The small voltage signal generally requires amplification and when this low level voltage signal is amplified the noise is also amplified resulting in an output signal having a low signal-to-noise ratio. In the present device the change of state of the superconductor element 32 is detected by the change of a magnetic field produced by a current through the element 34. This change may be made great depending on the magnitude of the current $I_A$ and when employing high sensitivity substances as the material 40 the readout signal becomes appreciably greater than the noise. Furthermore, the output signal from the readout device 20 is greater than the low level information signal produced in the superconductive circuit 10. The output signal from the readout device 20 may be any practical level depending upon the magnitude of the current $I_A$ and the choice of the characteristics of the material 40, the radiant energy source 50 and the detector 60.

According to another feature of the present invention the signal-to-noise ratio of the readout signal may be further increased by repetitively turning on and off the lamp 52 to provide a flashing light beam. This operation may be accomplished by energizing the lamp 50 from an alternating current source of a desired frequency. Background light is a source of noise. The background light is less for a flashing light beam than it is for a constant light beam caused by energization of the lamp 52 from a direct current source. Furthermore, a lamp energized from a direct current source causes drift in the output of the light sensitive device 60, whereas, no drift is present when the lamp 52 is energized from a pulse current source. Hence, noise is reduced and sensitivity is increased. Noise may be further minimized by maintaining stray light at a minimum.

It is now seen that the present invention provides a device for reading information from data processing equipment with no physical connection to the equipment. A material which, in the presence of a magnetic field, rotates the plane of polarization of radiant energy is controlled by the output stage of the equipment. Output signals in the output stage of the equipment cause the material to rotate the plane of polarization of radiant energy so that it strikes a receiving device which produces an output signal. When no information signal is present in the output stage of the equipment, the material is caused to rotate the plane of polarization of the radiant energy so that it does not strike the receiving device. Since the readout device of the present invention is especially adaptable to superconductive circuits and no physical connection is necessary to the output stage of the superconductive circuits, heat losses from physically connected output leads are eliminated. Reading information from the equipment by sensing the change in a magnetic field results in an output signal having a high signal-to-noise ratio and a high gain. The signal-to-noise ratio of the output signal of the radiant device is further improved by the use of a flashing light as the source of the radiant energy and by reducing stray light.

What is claimed is:

1. A device for reading binary information currents in cryogenic circuits comprising: a cryogenic circuit disposed in the influence of a cooling medium, the cryogenic circuit having first and second parallel circuit paths, means coupled to said first and second parallel circuit paths for applying a current to the first circuit path to represent a first binary condition and for applying a current to the second circuit path for representing a second binary condition, a piece of transparent material disposed adjacent the first parallel circuit path, a source of flashing light disposed outside the cooling medium for directing incident polarized light onto said piece of transparent material, said piece of transparent material responding to a magnetic field produced by current in said first parallel circuit path to rotate the plane of polarization of light passing therethrough, an analyzer disposed outside of said cooling medium for receiving reflected polarized light from said piece of material, said analyzer passing light having one plane of polarization and inhibiting the passage of light having a different plane of polarization, light responsive means disposed to receive light from said analyzer and provide an electrical output signal proportional to the light received, said light responsive means providing substantially no output signal when current is not applied to said first parallel circuit and said light responsive means supplying a substantially large signal when current is applied to said first parallel circuit path whereby the presence or absence of an output signal from said light responsive means is indicative of the respective binary conditions represented by current in the first or second parallel circuit paths of said cryogenic circuit.

2. A device for reading binary information currents in cryogenic circuits comprising: a cryogenic circuit disposed in the influence of a cooling medium, the cryogenic circuit having first and second parallel circuit paths, means coupled to said first and second parallel circuit paths for applying a current to the first circuit path to represent a first binary condition and for applying a current to the second circuit path for representing a second binary condition, a piece of transparent material disposed adjacent the first parallel circuit path, a source of flashing light disposed outside of the cooling medium for directing incident polarized light onto said piece of transparent material, said piece of transparent material responding to a magnetic field produced by current in said first parallel circuit path to rotate the plane of polarization of light passing therethrough, means to apply a bias magnetic field to said piece of transparent material, an analyzer disposed outside of said cooling medium for receiving reflected polarized light from said piece of material, said analyzer passing light having one plane of polarization and inhibiting the passage of light having a different plane of polarization, light responsive means disposed to receive light from said analyzer and provide an electric output signal proportional to the light received, said light responsive means providing substantially no output signal when current is applied to said second parallel circuit and said light responsive means supplying a substantially large signal when current is applied to said first parallel circuit path whereby the presence or absence of an output signal from said light responsive means is indicative of the respective binary conditions represented by current in the first or second parallel circuit paths of said cryogenic circuit.

References Cited in the file of this patent

UNITED STATES PATENTS

| | | |
|---|---|---|
| 1,629,727 | Murray | May 24, 1927 |
| 1,642,011 | Chubb | Sept. 13, 1927 |
| 2,189,122 | Andrews | Feb. 6, 1940 |
| 2,216,575 | Seinfield et al. | Oct. 1, 1940 |
| 2,418,964 | Arenberg | Apr. 15, 1947 |
| 2,442,298 | Liston | May 25, 1948 |
| 2,877,448 | Nyberg | Mar. 10, 1959 |
| 2,913,881 | Garwin | Nov. 24, 1959 |
| 2,928,075 | Anderson | Mar. 8, 1960 |
| 2,936,380 | Anderson | May 10, 1960 |

OTHER REFERENCES

Alers: Structure of the Intermediate State of Superconducting Lead, Physical Review, volume 105, January 1, 1957, pages 104–108.

Bremer: Cryogenic Devices in Logical Circuitry and Storage, Electrical Manufacturing, Feb. 1, 1958, pages 78–83.